United States Patent
Kojima (10) Patent No.: US 8,202,111 B2
(45) Date of Patent: Jun. 19, 2012

(54) CONNECTOR AND CABLE ASSEMBLY

(75) Inventor: Shigeru Kojima, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 13/144,634

(22) PCT Filed: Jan. 14, 2010

(86) PCT No.: PCT/JP2010/050307
§ 371 (c)(1),
(2), (4) Date: Aug. 24, 2011

(87) PCT Pub. No.: WO2010/082593
PCT Pub. Date: Jul. 22, 2010

(65) Prior Publication Data
US 2011/0294340 A1 Dec. 1, 2011

(30) Foreign Application Priority Data
Jan. 16, 2009 (JP) .................... 2009-008268

(51) Int. Cl.
*H01R 12/24* (2006.01)
(52) U.S. Cl. ...................................... 439/492
(58) Field of Classification Search .............. 439/492, 439/494, 495, 497, 579, 108, 260
See application file for complete search history.

(56) References Cited

U.S. PATENT DOCUMENTS

| 6,475,025 | B2 * | 11/2002 | Inoue | 439/495 |
| 7,667,138 | B2 * | 2/2010 | Koga | 174/110 R |
| 7,766,680 | B2 * | 8/2010 | Suzuki et al. | 439/260 |
| 8,039,748 | B2 * | 10/2011 | Koga | 174/110 R |
| 2006/0246268 | A1 | 11/2006 | Honjo et al. | |
| 2006/0252310 | A1 | 11/2006 | Yamada et al. | |
| 2008/0236868 | A1 * | 10/2008 | Koga | 174/117 F |
| 2008/0261422 | A1 * | 10/2008 | Hanyu | 439/153 |

FOREIGN PATENT DOCUMENTS

| JP | 59-121855 A | 8/1984 |
| JP | 62-103906 A | 5/1987 |
| JP | 63-142889 A | 6/1988 |
| JP | 08-242053 A | 9/1996 |
| JP | 09-017473 A | 1/1997 |
| JP | 11-201988 A | 7/1999 |
| JP | 2002-033556 A | 1/2002 |
| JP | 2002-184485 A | 6/2002 |
| JP | 2003-168523 A | 6/2003 |
| JP | 2006-310545 A | 11/2006 |
| JP | 2007-517356 A | 6/2007 |
| JP | 2007-179995 A | 7/2007 |

* cited by examiner

*Primary Examiner* — Tulsidas C Patel
*Assistant Examiner* — Phuongchi Nguyen
(74) *Attorney, Agent, or Firm* — Sughrue Mion, PLLC (57) ABSTRACT

A connector with which a cable assembly with suppressed generation of a noise during high-speed signal transmission can be formed, and a cable assembly using the connector. The connector includes: a substrate; multiple signal terminals provided parallel to each other on one surface of the substrate; and a ground layer provided on another surface of the substrate. Each of the signal terminals and the ground layer are disposed in such a manner that at least a portion of the ground layer and at least a portion of each of the signal terminals are superposed on each other with the substrate therebetween. Multiple holes are formed in the portion of the ground layer superposed on each of the signal terminals. A largest diameter of each of the holes is smaller than a distance between the centers of the signal terminals adjacent to each other.

13 Claims, 10 Drawing Sheets

CONNECTOR AND CABLE ASSEMBLY

CROSS REFERENCE TO RELATED APPLICATIONS

This application is a National Stage of International Application No. PCT/JP2010/050307 filed Jan. 14, 2010, claiming priority based on Japanese Patent Application No. 2009-008268 filed Jan. 16, 2009, the contents of all of which are incorporated herein by reference in their entirety.

TECHNICAL FIELD

The present invention relates to a connector and a cable assembly, and more specifically relates to a connector excellent in high-speed signal transmission characteristics and a cable assembly using the connector.

BACKGROUND ART

Some small electronic devices represented by mobile phones and small personal computers can be folded by causing a display part to pivot relative to an operation part. For the electrical connection between the display part and the operation part, such a small electronic device may use a cable assembly in which multiple micro coaxial cables are arranged side by side, and opposite end portions of the coaxial cables are brought together with connectors. Recently, to manufacture such a cable assembly at low cost, a connector of the cable assembly may be formed of a printed wiring board.

Patent Document 1 below describes an example of such a cable assembly. In this cable assembly, a connector is formed of a printed wiring board. Multiple signal terminals and a common conductor-connection part electrically connected to the ground are formed on one surface of a substrate of the printed wiring board. In addition, center conductors of the multiple coaxial cables are respectively connected to the signal terminals, while outer conductors thereof are connected to the common conductor-connection part. Signals are transmitted through the center conductors of the coaxial cables.

PRIOR ART DOCUMENT

Patent Document

Patent Document 1: Japanese Patent Application Publication No. Hei 09-17473

SUMMARY OF THE INVENTION

Objects to be Achieved by the Invention

With such a printed wiring board being used as the connector, when the frequency of a signal transmitted through the cable assembly is low (for example, 1 MHz), the transmitted signal is attenuated to a relatively small extent; thus, the signal is transmitted without much degradation. However, when the frequency of the signal transmitted through the cable assembly is high (for example, 100 MHz), the signal is attenuated to a large extent, and a noise may be generated due to crosstalk between the signal terminals. Then, the noise, if generated, degrades a signal to be transmitted, bringing about a problem of impeding the high-speed signal transmission.

Accordingly, an object of the present invention is to provide a connector with which a cable assembly capable of achieving high-speed signal transmission can be formed, and a cable assembly using the connector.

Means for Achieving the Objects

In order to achieve the above-described OBJECT, the present inventors have examined a method for reducing crosstalk of signals in a connector, the signal being transmitted through a cable assembly. Further, to reduce the crosstalk, the inventors have examined the configuration of a connector in which multiple signal terminals are provided parallel to each other on one surface of the substrate and a ground layer is provided on the other surface of the substrate, the ground layer and the signal terminals being superposed on each other with the substrate therebetween. In the cable assembly using connectors having such a configuration, the crosstalk in the connector is reduced. Thus, this seems to suggest that the high-speed signal transmission is achievable. However, the followings are found in such a connector. Specifically, since the impedances of the signal terminals are lowered, impedance mismatching is increased between the signal terminals and the cables, and a noise is generated due to signal reflection. Then, the present inventors have earnestly studied a method for reducing crosstalk without lowering the impedances of signal terminals, and thus completed the present invention.

Specifically, a connector of the present invention characterized as follows. Specifically, the connector includes: a substrate; multiple signal terminals provided parallel to each other on one surface of the substrate; and a ground layer provided on another surface of the substrate. Each of the signal terminals and the ground layer are disposed in such a manner that at least a portion of the ground layer and at least a portion of each signal terminal are superposed on each other with the substrate therebetween. Multiple holes are formed in the portion of the ground layer superposed on each signal terminal. A largest diameter of each of the holes is smaller than a distance between centers of the signal terminals adjacent to each other.

According to such a connector, when signals are transmitted through the multiple signal terminals formed on the one surface of the substrate, unnecessary radiation generated from the signal terminals is absorbed by the ground layer provided on the other surface of the substrate, reducing crosstalk between the signal terminals. Accordingly, a noise due to the crosstalk is suppressed even during high-speed signal transmission.

Moreover, the multiple holes are formed in the portion of the ground layer where the ground layer is superposed on the signal terminals. Accordingly, the capacitance components of the signal terminals and the ground layer are suppressed. Thus, lowering in the impedances of the signal terminals is suppressed. This suppresses impedance mismatching due to lowered impedances of the signal terminals in a cable assembly using such a connector. Thus, a noise due to signal reflection is suppressed even during high-speed signal transmission.

Thus, as described above, a noise due to the crosstalk is suppressed even during high-speed signal transmission, and a noise due to signal reflection attributed to the impedance mismatching is suppressed. Accordingly, a cable assembly using the connector according to the present invention is excellent in high-speed signal transmission characteristics.

In addition, the largest diameter of the hole formed in the ground layer is set smaller than the distance between the centers of the adjacent signal terminals. Accordingly, in a case where the connector of the present invention is connected to a device and the signal terminals and the ground layer are clamped by a terminal of the device, portions of the substrate where the holes are located undergo deformation or the like, thereby suppressing deformation of portions of the signal terminals superposed on the holes.

Further, the connector preferably further includes: at least one ground terminal provided between the signal terminals in such a manner as to be superposed on the ground layer with the substrate therebetween; and a first penetrating conductor provided in such a manner as to penetrate the substrate, and connecting the ground layer to the ground terminal.

According to such a connector, since being electrically connected to the ground layer through the first penetrating conductor, the ground terminal is short circuited. Moreover, since the ground terminal is provided between the signal terminals, unnecessary radiation emitted from the signal terminals is absorbed by the ground terminal. This can suppress crosstalk between the signal terminals with the ground terminal disposed therebetween. Accordingly, generation of a noise can be further suppressed.

Further, in the connector, the holes are preferably not formed in the portion of the ground layer superposed on the ground terminal.

According to such a connector, no hole is formed in the portion of the ground layer superposed on the ground terminal. Accordingly, the first penetrating conductor can be more properly connected to the ground layer. Thus, the electrical connection can be properly established between the ground layer and the ground terminal.

Further, the connector preferably further includes an outer-conductor common connection part provided on the one surface of the substrate in such a manner as to be separated at a predetermined distance from each signal terminal; and a second penetrating conductor provided in such a manner as to penetrate the substrate, and connecting the ground layer to the outer-conductor common connection part. The distance between each signal terminal and the outer-conductor common connection part is preferably 0.15 to 0.5 mm.

According to such a connector, in a case where a cable assembly is fabricated with a center conductor of a coaxial cable serving as a signal line and an outer conductor thereof serving as a ground line, the distance between each of the signal terminals and the outer-conductor common connection part is 0.5 mm or shorter. Accordingly, impedance mismatching between the signal terminal of the coaxial cable and the outer-conductor common connection part can be effectively suppressed. Moreover, in a case where the signal terminal is fixed to the signal line with a solder and the outer-conductor common connection part is fixed to the ground line with a solder, the distance between each of the signal terminals and the outer-conductor common connection part is 0.15 mm or longer. Accordingly, a short circuit between the signal terminal and the outer-conductor common connection part due to a solder bridge or the like can be suppressed.

Moreover, in the connector, at least one of the signal terminals may have a length different from those of the other signal terminals.

Moreover, in the connector, a distance between centers of at least a pair of the signal terminals adjacent to each other may be different from distances between centers of the other pairs of the signal terminals adjacent to each other.

Moreover, the connector preferably further includes: a second substrate; and multiple second signal terminals provided parallel to each other on one surface of the second substrate. The second substrate is preferably disposed in such a manner that another surface of the second substrate faces the ground layer. Each of the second signal terminals is preferably disposed in such a manner that the portion of the ground layer where the multiple holes are formed and at least a portion of each second signal terminal are superposed on each other with the second substrate therebetween.

According to such a connector, since the signal lines can be connected on both surfaces, a cable assembly having a larger number of signal lines can be fabricated without increasing the width.

Furthermore, the connector preferably further includes: at least one ground terminal provided between the signal terminals in such a manner as to be superposed on the ground layer with the substrate therebetween; at least one second ground terminal provided between the second signal terminals in such a manner as to be superposed on the ground layer with the second substrate therebetween; and a first penetrating conductor provided in such a manner as to penetrate the substrate and the second substrate, and connecting the ground terminal and the second ground terminal to the ground layer According to such a connector, crosstalk between the signal terminals with the ground terminal disposed therebetween and crosstalk between the second signal terminals with the second ground terminal disposed therebetween can be suppressed. Accordingly, further generation of a noise can be suppressed.

Furthermore, in the connector, the holes are preferably not formed in the portion of the ground layer superposed on the ground terminal and the second ground terminal.

According to such a connector, no hole is formed in the portion of the ground layer superposed on the second ground terminal. Accordingly, the first penetrating conductor can be more properly connected to the ground layer. Thus, the electrical connection can be properly established between the ground layer and the second ground terminal.

Moreover, the connector preferably further includes: an outer-conductor common connection part provided on the one surface of the substrate; a second outer-conductor common connection part provided on the one surface of the second substrate; and a second penetrating conductor provided in such a manner as to penetrate the substrate and the second substrate, and connecting the outer-conductor common connection part and the second outer-conductor common connection part to the ground layer. The distance between the signal terminal and the outer-conductor common connection part and the distance between the second signal terminal and the second outer-conductor common connection part are preferably both 0.15 to 0.5 mm.

According to such a connector, in a case where a cable assembly is fabricated with a center conductor of a coaxial cable serving as a signal line and an outer conductor thereof serving as a ground line, the distance between each of the signal terminals and the outer-conductor common connection part and the distance between each of the second signal terminals and the second outer-conductor common connection part are both 0.5 mm or shorter. Accordingly, impedance mismatching between the signal terminal of the coaxial cable and the outer-conductor common connection part and between the second signal terminal and the second outer-conductor common connection part can be effectively suppressed. Moreover, when the signal terminal and the second signal terminal are fixed to signal lines with a solder and the outer-conductor common connection part and the second outer-conductor common connection part are further fixed to ground lines with a solder, the distance between each of the signal terminals and the outer-conductor common connection part and the distance between each of the second signal terminals and the second outer-conductor common connection part are both 0.15 mm or longer. Accordingly, a short circuit due to a solder bridge or the like can be suppressed.

Moreover, in the connector, at least one of the second signal terminals may have a length different from those of the other second signal terminals.

Moreover, in the connector, a distance between centers of at least a pair of the second signal terminals adjacent to each other may be different from distances between centers of the other pairs of the second signal terminals adjacent to each other.

In addition, a cable assembly of the present invention is characterized as follows. Specifically, the cable assembly includes: a pair of the connectors described above; multiple signal lines provided parallel to each other; and at least one ground line. The signal lines have opposite end portions respectively connected to the signal terminals of each of the connectors. The ground line has opposite end portions each electrically connected to the ground layer of each connector.

According to such a cable assembly, crosstalk between the signal terminals in the connector is suppressed, and lowering in the impedances of the signal terminals is suppressed. Accordingly, generation of a noise due to crosstalk and generation of a noise due to signal reflection attributed to impedance mismatching are suppressed. Generation of a noise can be suppressed during high-speed signal transmission.

Moreover, a cable assembly of the present invention is characterized as follows. Specifically, the cable assembly includes: a pair of the connectors described above; multiple signal lines provided parallel to each other; and at least one ground line. Among the multiple signal lines, some signal lines have opposite end portions connected to the signal terminals of each of the connectors, while the other signal lines have opposite end portions connected to the second signal terminals of each connector. The ground line has opposite end portions each electrically connected to the ground layer of each connector.

According to such a cable assembly, generation of a noise due to crosstalk and generation of a noise due to signal reflection attributed to impedance mismatching are suppressed. Generation of a noise can be suppressed during high-speed signal transmission. Moreover, since the signal lines are connected on both surfaces of the connector, this eliminates the need to increase the width and a larger number of signals can be transmitted.

EFFECT OF THE INVENTION

Accordingly, the present invention provides: a connector with which a cable assembly with suppressed noise generation during high-speed signal transmission can be formed; and a cable assembly using the connector.

BEST MODE FOR CARRYING OUT THE INVENTION

Hereinafter, preferred embodiments of a connector and a cable assembly according to the present invention will be described in detail with reference to the drawings.

(First Embodiment)

Figure 1:
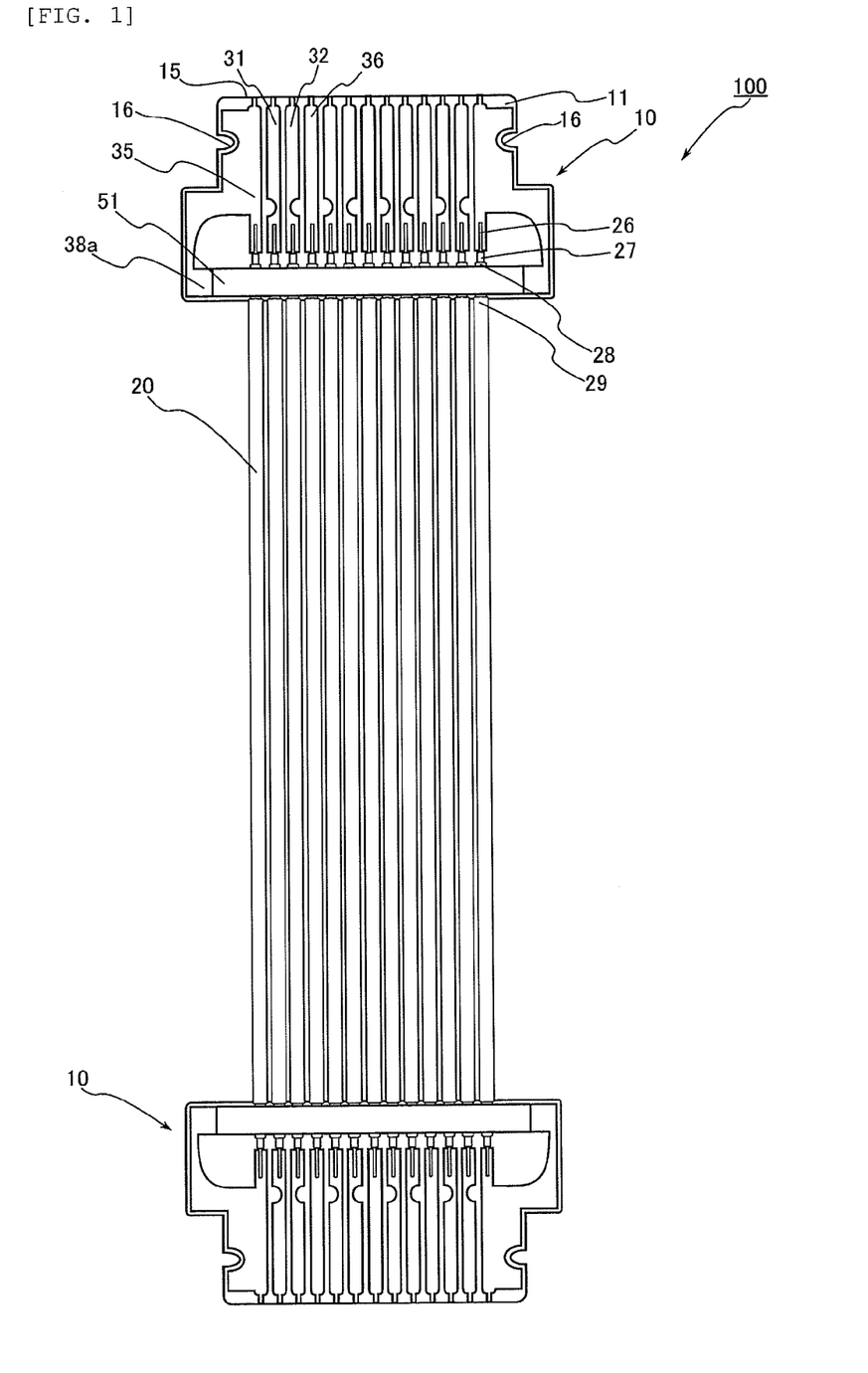
FIG. 1 is a front view showing a cable assembly according to a first embodiment of the present invention.

FIG. 1 is a plan view showing a cable assembly according to a first embodiment of the present invention.

As shown in FIG. 1, a cable assembly 100 includes multiple coaxial cables 20 provided parallel to each other and a pair of connectors 10 each connected to the coaxial cables 20.

Figure 2:
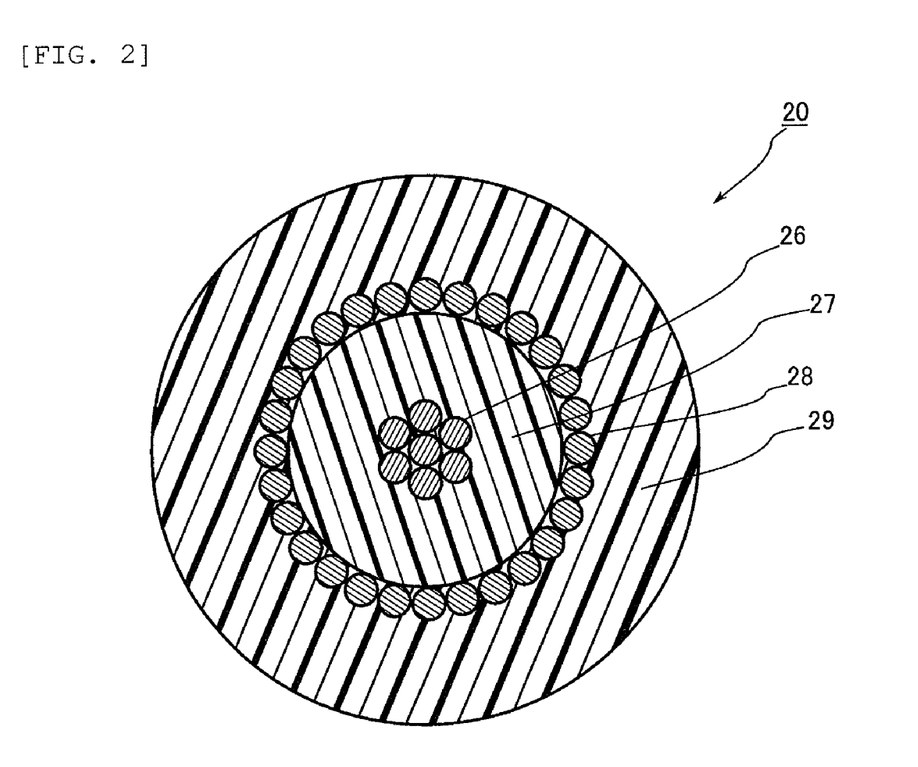
FIG. 2 is a cross-sectional view taken perpendicularly to a longitudinal direction of a cable in FIG. 1.

First, the coaxial cable 20 will be described. FIG. 2 is a cross-sectional view taken perpendicularly to a longitudinal direction of the coaxial cable 20.

As shown in FIG. 2, the coaxial cable 20 has, in the center, center conductors 26 formed of twisted metal conductor wires. Moreover, the center conductors 26 are covered with an insulating layer 27 made of an insulating resin. Outer conductors 28 formed of metal braids are provided on the outer peripheral surface of the insulating layer 27. Further, the outer conductors 28 are covered with a sheath 29 made of a resin.

Figure 3:
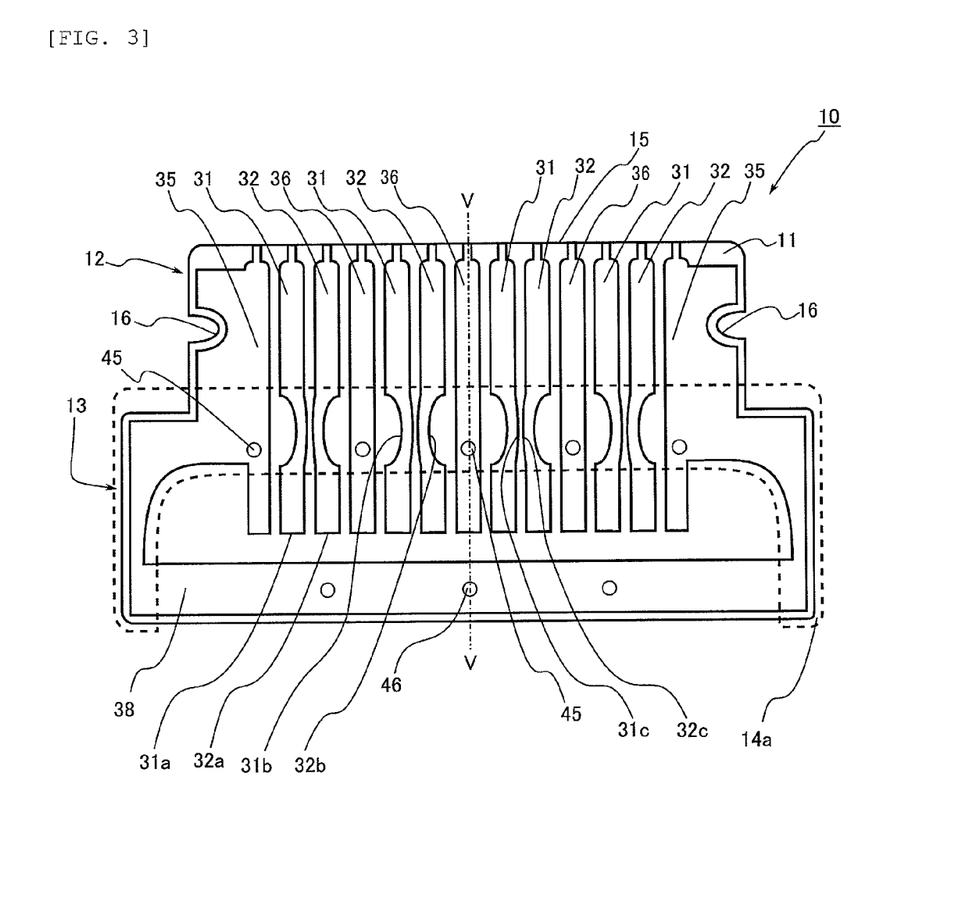
FIG. 3 is a front view of a connector in FIG. 1.
Figure 4:
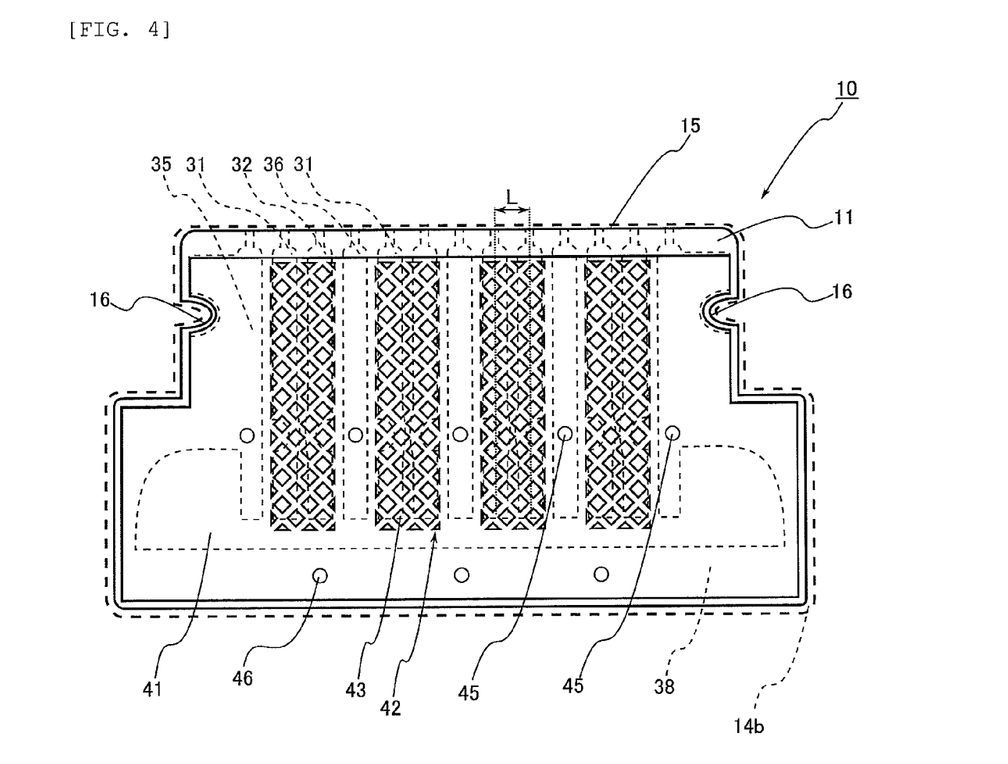
FIG. 4 is a rear view of a connector in FIG. 1.

Next, the connector 10 will be described. FIG. 3 is a front view of the connector 10 in FIG. 1. FIG. 4 is a rear view of the connector 10 in FIG. 1. In addition, FIG. 5 is a cross-sectional view of the connector 10, taken along the line V-V in FIG. 3.

Figure 5:
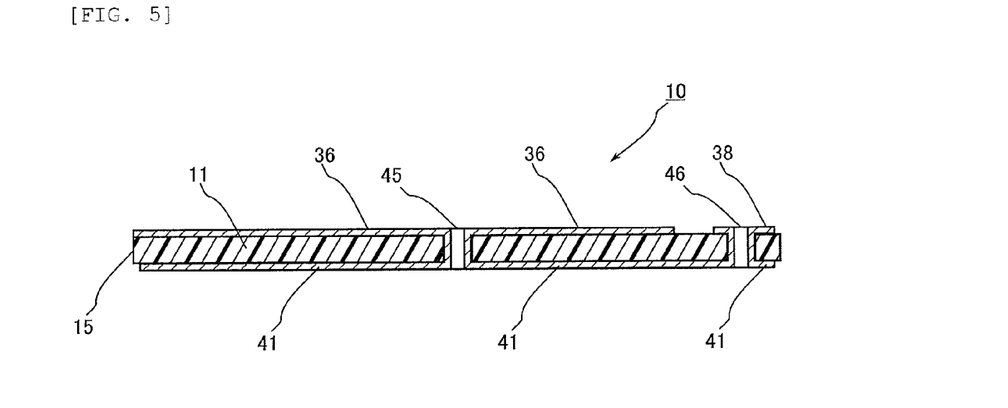
FIG. 5 is a cross-sectional view of the connector, taken along the line V-V in FIG. 3.

As shown in FIGS. 3 to 5, the connector 10 is formed of a flexible printed wiring board, and has as the main constituents: a substrate 11 having flexibility; a pair of ground terminals 35 and multiple ground terminals 36 provided on one surface of the substrate 11; multiple signal terminals 31, 32 provided on the one surface of the substrate 11; an outer-conductor common connection part 38 provided on the one surface of the substrate 11 and connected to each of the ground terminals 35; a ground layer 41 provided on the other surface of the substrate 11; multiple first penetrating conductors 45 provided in such a manner as to penetrate the substrate 11, and electrically connecting the ground terminals 35, 36 to the ground layer 41; and multiple second penetrating conductors 46 provided in such a manner as to penetrate the substrate 11, and electrically connecting the outer-conductor common connection part 38 to the ground layer 41.

As shown in FIG. 3, the substrate 11 has a substantially-rectangular narrower width part 12 and a substantially-rectangular wider width part 13. A long side of the narrower width part 12 is connected to a long side of the wider width part 13. In this manner, the substrate 11 has a substantially T-shaped outer shape. The narrower width part 12 is to be inserted into an unillustrated external device. Further, the substrate 11 has: a connector edge 15 which is a long side of the narrower width part 12 on a side remote from the wider width part 13; and a fitting concave portions 16 into which the external device is fitted when the narrower width part 12 is inserted into the external device.

The outer-conductor common connection part 38 has a substantially rectangular shape, and is provided on the one surface of the substrate 11 along a long side of the wider width part 13 on a side remote from the narrower width part 12.

The signal terminals 31, 32 are symmetrical with each other, and each have an elongated shape and are provided across the narrower width part 12 and the wider width part 13. Moreover, front end portions of the signal terminals 31, 32 are disposed to be in contact with the connector edge 15 so that the signal terminals 31, 32 can come into contact with an electronic component or an electronic device. Further, the signal terminals 31, 32 are disposed at positions away from the outer-conductor common connection part 38 at predetermined intervals. Specifically, rear end portions 31a, 32a of the signal terminals 31, 32, which are end portions on the outer-conductor common connection part 38 side, are disposed at positions away from an end portion, on the signal terminal 31, 32 side, of the outer-conductor common connection part 38 at predetermined intervals. Thus, the signal terminals 31, 32 are disposed to extend from the connector edge 15 of the substrate 11 to the positions away from the outer-conductor common connection part 38 at predetermined distances.

Additionally, each of the signal terminals 31 is paired with one of the signal terminals 32. The pairs of the signal terminals 31 and the signal terminals 32 are disposed adjacent to each other. Furthermore, such multiple pairs of the signal terminals 31, 32 are disposed on the one surface of the substrate 11, and the distance between the centers of each paired signal terminals 31, 32 is set equal.

Each of the ground terminals 36 has an elongated shape and is provided across the narrower width part 12 and the wider width part 13. Moreover, each ground terminal 36 has the same length as those of the signal terminals 31, 32. A front end portion of each ground terminal 36 is disposed to be in contact with the connector edge 15, while a rear end portion thereof is disposed at a position away from the outer-conductor common connection part 38 at a predetermined interval. Further, each ground terminal 36 is disposed between a pair of the signal terminals 31, 32 and another pair of the signal terminals 31, 32. Thus, each ground terminal 36 is adjacent to the signal terminals 31, 32 in such a manner of being sandwiched between the signal terminal 31 of a pair of the signal terminals 31, 32 and the signal terminal 32 of another pair of the signal terminals 31, 32.

The paired ground terminals 35 are provided to sandwich all the signal terminals 31, 32 and the ground terminals 36 therebetween. Moreover, one of the paired ground terminals 35 is adjacent to the signal terminal 31 while the other ground terminal 35 is adjacent to the signal terminal 32. Further, portions of the ground terminals 35 each partly extend to be connected to respective opposite end portions of the outer-conductor common connection part 38.

In addition, the signal terminal 31 adjacent to the ground terminal 35 has a concave portion 31b formed on a side portion facing the ground terminal 35. The signal terminal 31 adjacent to the ground terminal 36 has a concave portion 31b formed on a side portion thereof facing ground terminal 36. Further, a convex portion 31c is formed on a side portion, of the signal terminal 31, on a side on which the concave portion 31b is not formed. The convex portion 31c is formed at the same position as the concave portion 31b in a direction along a longitudinal direction of the signal terminal 31. Accordingly, even when the concave portion 31b is formed deeply in a direction transecting the signal terminal 31, an excessive increase in the resistance of the signal terminal 31 due to the extremely narrowed width of the signal terminal 31 is suppressed at the location where the concave portion 31b is formed.

Similarly, the signal terminal 32 adjacent to the ground terminal 35 has a concave portion 32b formed on a side portion facing the ground terminal 35 side. The signal terminal 32 adjacent to the ground terminal 36 has a concave portion 32b formed on a side portion thereof facing the ground terminal 36. Further, a convex portion 32c is formed on a side portion, of the signal terminal 32, on a side on which the concave portion 32b is not formed. The convex portion 32c is formed at the same position as the concave portion 32b in a direction along a longitudinal direction of the signal terminal 32. Accordingly, even when the concave portion 32b is formed deeply in a direction transecting the signal terminal 32, an excessive increase in the resistance of the signal terminal 32 due to the extremely narrowed width of the signal terminal 32 is suppressed at the location where the concave portion 32b is formed.

These concave portions 31b, 32b adjust the capacitances of the capacitive coupling between the ground terminals 35, 36 and the signal terminals 31, 32.

Note that, on the front surface of the substrate 11, the areas of the concave portions 31b, 32b and the convex portions 31c, 32c formed on the signal terminals 31, 32 as well as the extended portions of the ground terminals 35 are covered with a protection insulating film 14a indicated by the broken line.

As shown in FIG. 4, the ground layer 41 is formed to cover substantially the entire substrate 11 except for the vicinity of the connector edge 15. Accordingly, the ground layer 41 is superposed on the ground terminals 35, 36 and the signal terminals 31, 32 with the substrate 11 therebetween in a direction perpendicular to the substrate 11. Moreover, grid portions 42 are formed at positions of the ground layer 41 that are superposed on the signal terminals 31, 32. Multiple holes 43 are formed in the grid portions 42. The largest diameter of the hole 43 is set smaller than a distance L between the centers of the adjacent signal terminals 31, 32. In this embodiment, the length of a diagonal of the squared hole is formed shorter than the distance between the centers of the adjacent signal terminals 31, 32. Meanwhile, no grid portion 42 is formed at positions of the ground layer 41 that are superposed on the ground terminals 35, 36 and on the outer-conductor common connection part 38. Thus, no hole 43 is formed at the positions of the ground layer 41 that are superposed on the ground terminals 35, 36 and on the outer-conductor common connection part 38.

Note that the entire rear surface of the substrate 11 is covered with a protection insulating film 14b indicated by the broken line.

As shown in FIG. 5, the first penetrating conductors 45 constituted of through-holes connecting the ground layer 41 to the ground terminals 36 and the second penetrating conductors 46 constituted of through-holes connecting the ground layer 41 to the outer-conductor common connection part 38 are formed in the substrate 11. Moreover, as shown in FIGS. 3 and 4, the first penetrating conductors 45 constituted of through-holes connecting the ground layer 41 to the ground terminals 35 are formed in the substrate 11. In this manner, the ground terminals 35, 36 and the outer-conductor common connection part 38 are electrically connected to the ground layer 41.

Note that, as described above, no hole 43 is formed at the positions of the ground layer 41 that are superposed on the ground terminals 35, 36 and on the outer-conductor common connection part 38. Accordingly, the first penetrating conductors 45 and the second penetrating conductors 46 can be more properly connected to the ground layer 41. Thus, in this embodiment, the ground layer 41 can be electrically connected to the ground terminals 35, 36, and the outer-conductor common connection part 38 properly.

Next, the connection between the coaxial cables 20 and the connectors 10 will be described.

As shown in FIG. 1, the center conductor 26 and the outer conductor 28 are exposed at each opposite end portion of the coaxial cables 20. Moreover, the center conductors 26 of a pair of the coaxial cables 20 are disposed on the ground terminals 35 and fixed thereto with an unillustrated solder. Further, the center conductors 26 of some of the coaxial cables 20 are disposed on the ground terminals 36 and fixed thereto with an unillustrated solder. In addition, the center conductors 26 of the rest of the coaxial cables 20 are disposed on the signal terminals 31, 32 and fixed thereto with an unillustrated solder. Furthermore, the outer conductors 28 of all the coaxial cables 20 are disposed on the outer-conductor common connection part 38 and fixed thereto with an unillustrated solder while being sandwiched between the outer-conductor common connection part 38 and a ground bar 51. In this manner, the center conductors 26 connected to the ground terminals 35, 36 and the outer conductors 28 connected to the outer-conductor common connection part 38 serve as ground lines. Furthermore, the center conductors 26 connected to the signal terminals 31, 32 serve as signal lines.

Note that the distance between the outer-conductor common connection part 38 and the rear end portions 31a, 32a of the signal terminals 31, 32 shown in FIG. 3 is preferably 0.15 to 0.5 mm, more preferably 0.2 to 0.3 mm. If the distance between the outer-conductor common connection part 38 and the rear end portions 31a, 32a is 0.5 mm or shorter in a case where the center conductors 26 of the coaxial cables 20 are connected to the signal terminals 31, 32 as described above, the impedances can be matched closely. If the distance is 0.3 mm or shorter, the impedances can be matched further closely. Meanwhile, in a case where the center conductors 26 are fixed on the signal terminals 31, 32 with the solder while the outer conductors 28 are fixed on the outer-conductor common connection part 38 with the solder as described above, the distance between the outer-conductor common connection part 38 and the rear end portions 31a, 32a is preferably 0.15 mm or longer because a short circuit between the outer-conductor common connection part 38 and the signal terminals 31, 32 due to a solder bridge or the like can be effectively suppressed. The distance is more preferably 0.2 mm or longer because the short circuit can be further prevented and the productivity is improved.

As has been described above, according to such a cable assembly 100, the center conductors 26 of the coaxial cables 20 serving as the signal lines are disposed on the signal terminals 31, 32 of the connector 10, and a signal is transmitted between the outside of the cable assembly 100 and the center conductors 26 of the coaxial cables 20 through the signal terminals 31, 32. Moreover, the center conductors 26 of the coaxial cables 20 connected to the ground terminals 35, 36 and serving as the ground lines as well as the outer conductors 28 of the coaxial cables 20 connected to the outer-conductor common connection part 38 and serving as the ground lines are grounded through the ground layer 41.

The signal terminals 31, 32 are formed on the one surface of the substrate 11 of the connector 10, while the ground layer 41 is formed on the other surface of the substrate. The signal terminals 31, 32 and the ground layer 41 are disposed in such a manner as to be superposed on each other with the substrate 11 therebetween. Thus, unnecessary radiation generated from the signal terminals 31, 32 is absorbed by the ground layer 41, reducing crosstalk between the signal terminals 31, 32. Accordingly, generation of a noise due to the crosstalk is suppressed even during high-speed signal transmission.

Further, the multiple holes 43 are formed in the portions of the ground layer 41 that are superposed on the signal terminals 31, 32. Accordingly, the capacitive coupling between the signal terminals 31, 32 and the ground layer 41 is suppressed to be low. Hence, lowering in the impedances of the signal terminals 31, 32 is suppressed. This suppresses impedance mismatching between the signal terminals 31, 32 and the center conductors 26 of the coaxial cables 20 which otherwise occurs due to lowered impedances of the signal terminals 31, 32. Accordingly, generation of a noise due to signal reflection is suppressed even during high-speed signal transmission.

In this manner, in the connector 10, generation of a noise due to crosstalk during high-speed signal transmission is suppressed, and generation of a noise due to signal reflection attributed to the impedance mismatching is suppressed. Thus, the cable assembly 100 is excellent in high-speed signal transmission characteristics.

Moreover, the largest diameter of the multiple holes 43 formed in the ground layer 41 is set smaller than the distance L between the centers of the adjacent signal terminals 31, 32. Accordingly, in a case where the connector 10 is connected to a device, even if the signal terminals 31, 32 and the ground layer 41 are clamped by a terminal of the device, portions of the substrate 11 where the holes 43 are located undergo deformation or the like, thereby preventing deformation of portions of the signal terminals 31, 32 that correspond to the holes 43.

In addition, in the cable assembly 100, the ground terminals 36 are each disposed between the signal terminal 31 and the signal terminal 32. Accordingly, unnecessary radiation emitted from the signal terminals 31, 32 is absorbed by the ground terminals 36. Thus, generation of crosstalk beyond the ground terminals 36 is suppressed between the signal terminals 31, 32 located at both sides of the ground terminal 36. This suppresses superimposition of a noise due to the crosstalk of a signal transmitted through the cable assembly 100.

Furthermore, in the cable assembly 100, the ground lines include some of the center conductors 26 of the coaxial cables 20 as well as the outer conductors 28 of the coaxial cables 20. The outer conductors 28 are disposed on the outer-conductor common connection part 38 and electrically connected to the ground layer 41 through the second penetrating conductors 46. Accordingly, the ground is enhanced, and thus the countermeasure against EMI (Electro Magnetic Interference) can be further improved.

(Second Embodiment)

Next, a second embodiment of the present invention will be described in detail with reference to FIGS. 6 to 8. Note that constituents same or equivalent to those in the first embodiment are denoted by the same reference numerals, and redundant description will be omitted unless otherwise specifically stated.

Figure 6:
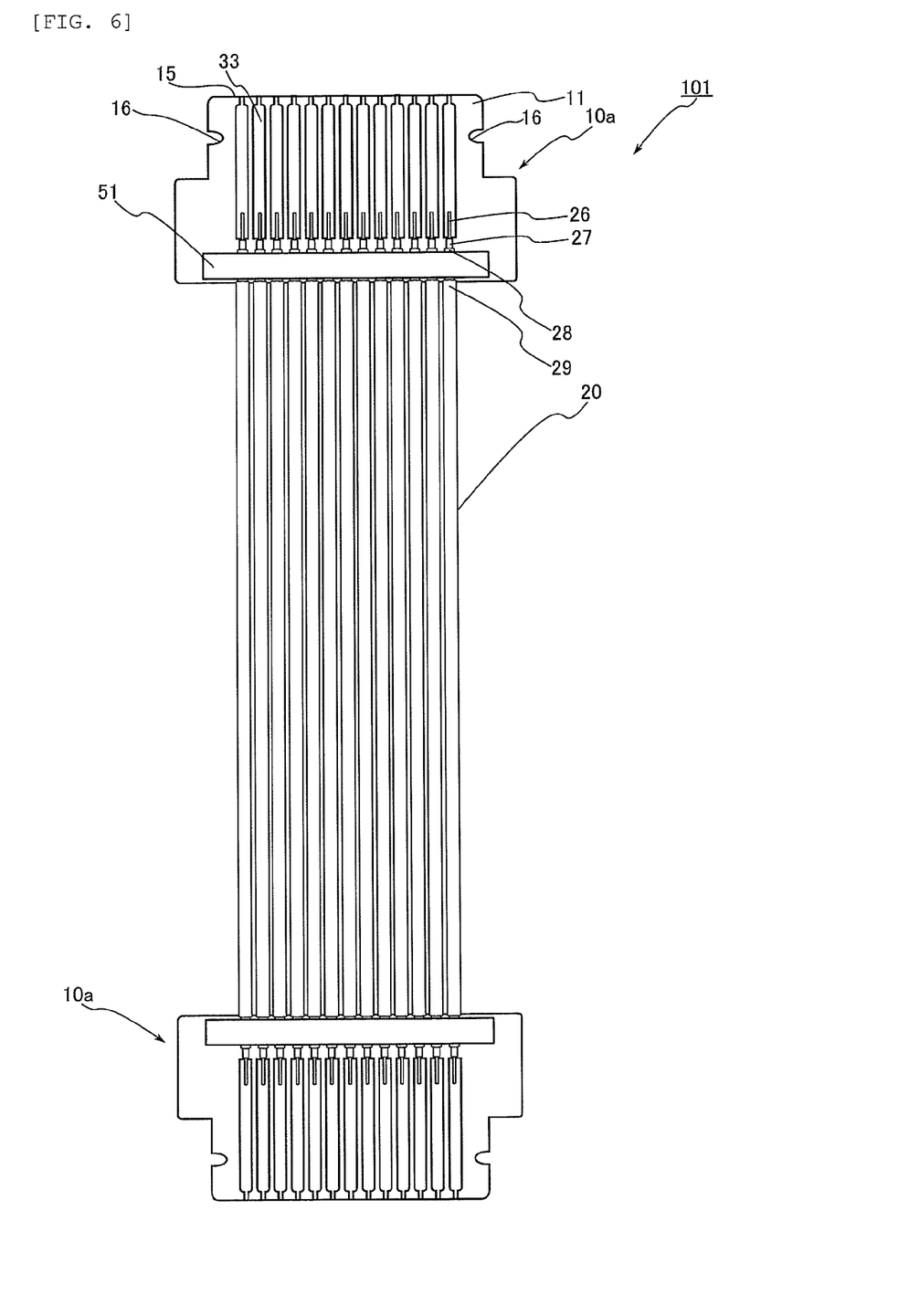
FIG. 6 is a front view showing a cable assembly according to a second embodiment of the present invention.

FIG. 6 is a front view showing a cable assembly according to the second embodiment of the present invention.

As shown in FIG. 6, a cable assembly 101 of this embodiment includes, as the main constituents, multiple coaxial cables 20 and a pair of connectors 10a.

First, the connector 10a will be described. FIG. 7 is a front view of the connector 10a shown in FIG. 6. As shown in FIG. 7, the connector 10a is different from the connector 10 of the first embodiment in that multiple signal terminals 33 parallel to each other and an outer-conductor common connection part 38a are provided on one surface of the substrate 11, and that no ground terminals 35, 36 are provided. Note that, in this embodiment, the signal terminals are provided at equal intervals, and accordingly the distance between the centers of a pair of the signal terminals 33, 33 adjacent to each other is equal to the distances between the centers of the other pairs of the signal terminals 33, 33.

The outer-conductor common connection part 38a has a shape similar to that of the outer-conductor common connection part 38 of the first embodiment. In addition, the outer-conductor common connection part 38a is different from the outer-conductor common connection part 38 of the first embodiment in that opposite ends of the outer-conductor common connection part 38a are not connected to terminals.

The signal terminals 33 each have an elongated shape, but are different from the signal terminals 31, 32 of the first embodiment in that no concave portion and convex portion 1 are formed on a side portion in a longitudinal direction thereof.

Figure 8:
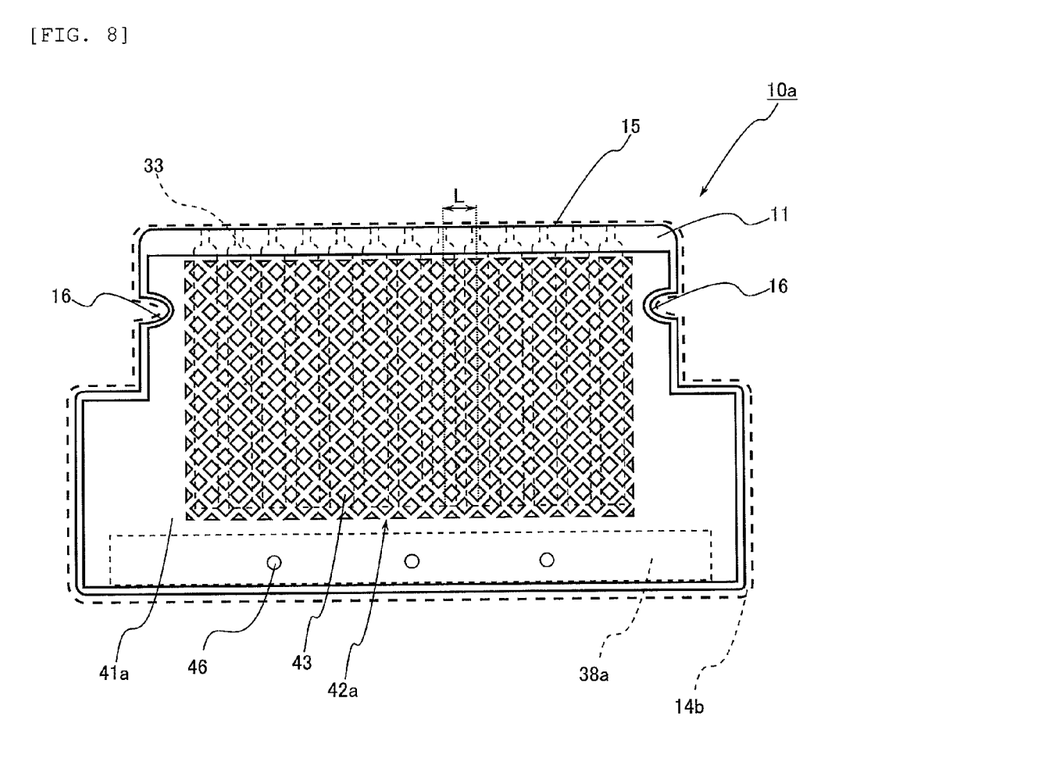
FIG. 8 is a rear view of a connector in FIG. 6.

FIG. 8 is a rear view of the connector 10a shown in FIG. 6. As shown in FIG. 8, the outer shape of a ground layer 41a is the same as the outer shape of the ground layer 41 of the first embodiment. Moreover, in this embodiment, as described above, no ground terminals are provided between the signal terminals, and accordingly a grid portion 42a is different from the grid portion 42 of the first embodiment in that the grid portion 42a is provided over an entire region of the ground layer 41a where the ground layer 41a is superposed on the signal terminals 33.

Further, the outer-conductor common connection part 38a is, as in the connector 10 of the first embodiment, electrically connected to the ground layer 41a through the second penetrating conductors 46.

Next, the connection between the connectors 10a and the coaxial cables 20 will be described. As shown in FIG. 6, the center conductors 26 and the outer conductors 28 are exposed at opposite end portions of the coaxial cables 20. Moreover, the center conductors 26 of the coaxial cables 20 are respectively disposed on the signal terminals 33 and fixed thereto with an unillustrated solder. Further, the outer conductors 28 of the coaxial cables 20 are disposed on the outer-conductor common connection part 38a and fixed thereto with an unillustrated solder while being sandwiched between the outer-conductor common connection part 38a and the ground bar 51. In this manner, the outer conductors 28 connected to the outer-conductor common connection part 38a serve as ground lines, while the center conductors 26 connected to the signal terminals 33 serves as signal lines.

Figure 7:
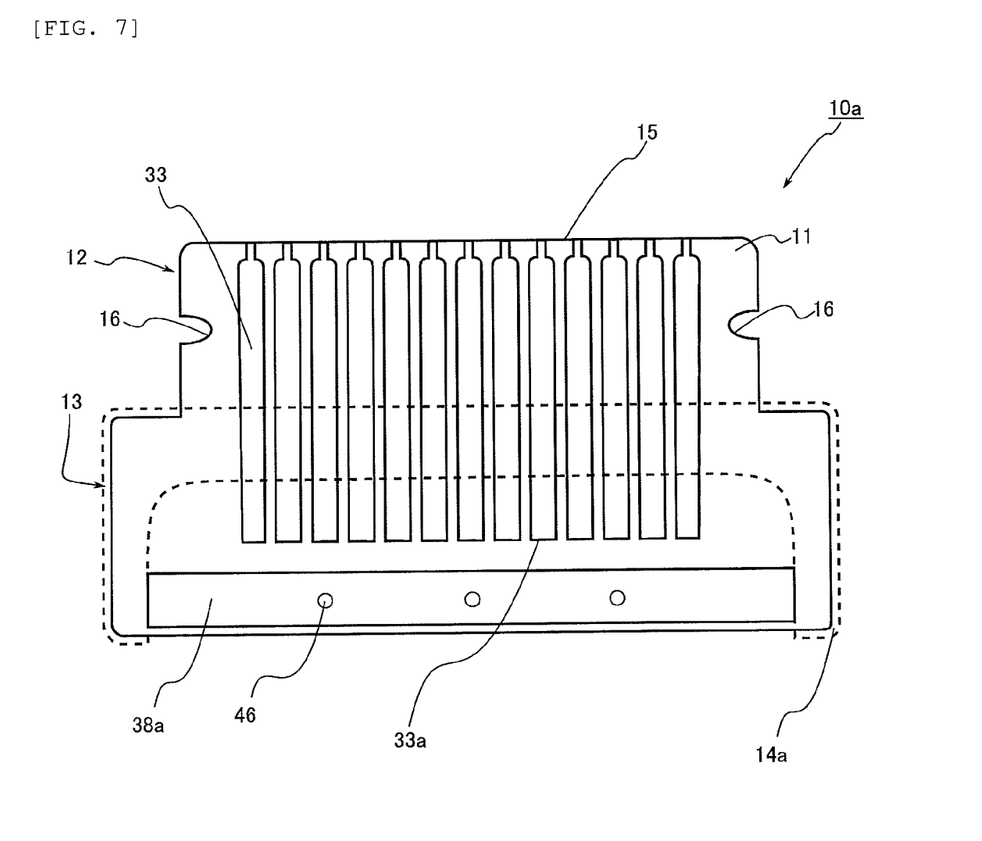
FIG. 7 is a front view of a connector in FIG. 6.

Note that the distance between the outer-conductor common connection part 38a and a rear end portion 33a of the signal terminal 33 shown in FIG. 7 is preferably the same distance as the distance between the outer-conductor common connection part 38 and the signal terminals 31, 32 for the same reason in the first embodiment.

According to the cable assembly 101 of this embodiment, the cable assembly 101 can be used in an unbalanced transmission system. This eliminates the need to dispose a ground terminal between the signal terminals, and enables more efficient signal transmission.

(Third Embodiment)

Next, a third embodiment of the present invention will be described in detail with reference to FIGS. 9 and 10. Note that constituents same or equivalent to those in the first embodiment are denoted by the same reference numerals, and redundant description will be omitted unless otherwise specifically stated.

Figure 9:
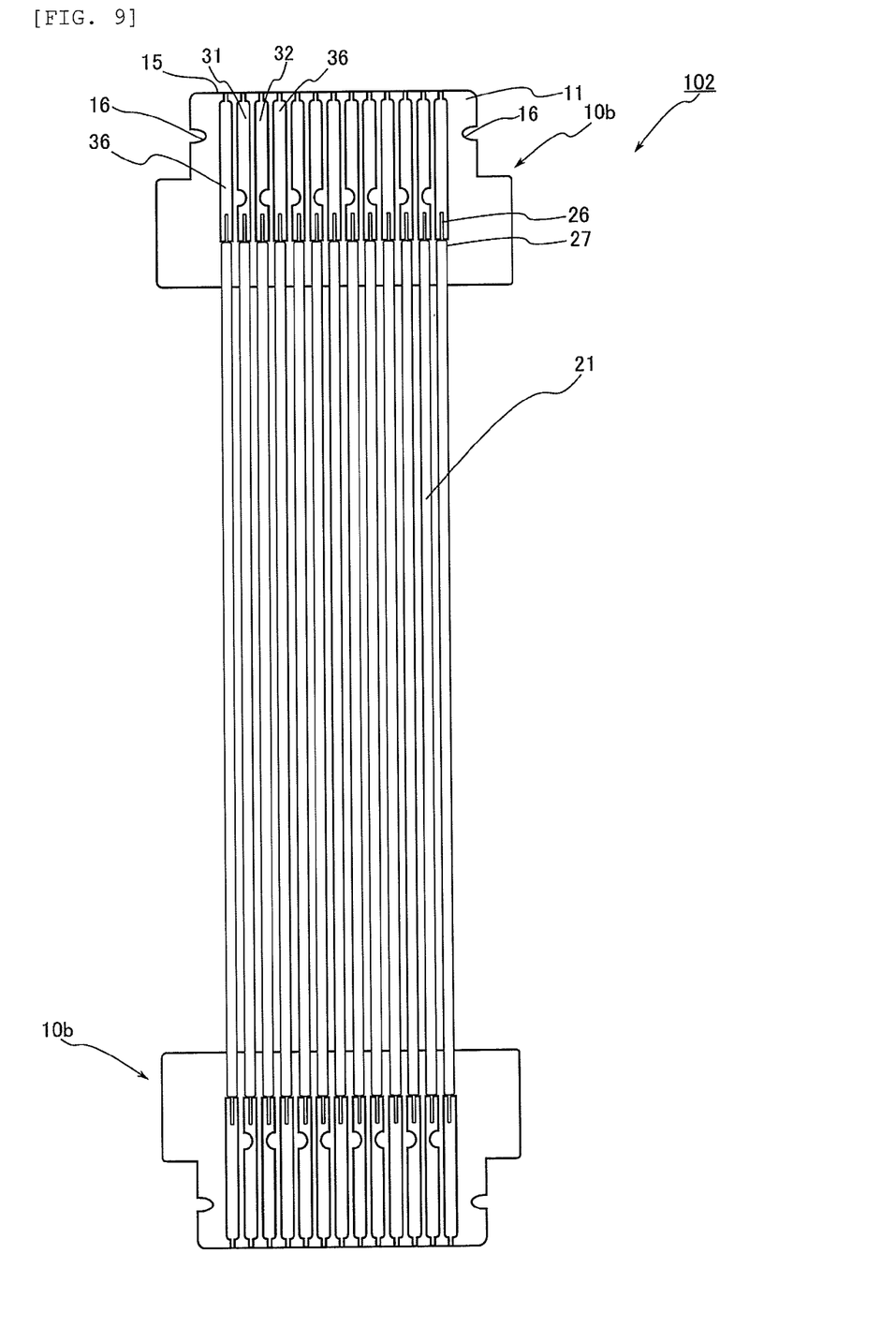
FIG. 9 is a front view showing a cable assembly according to a third embodiment of the present invention.
Figure 10:
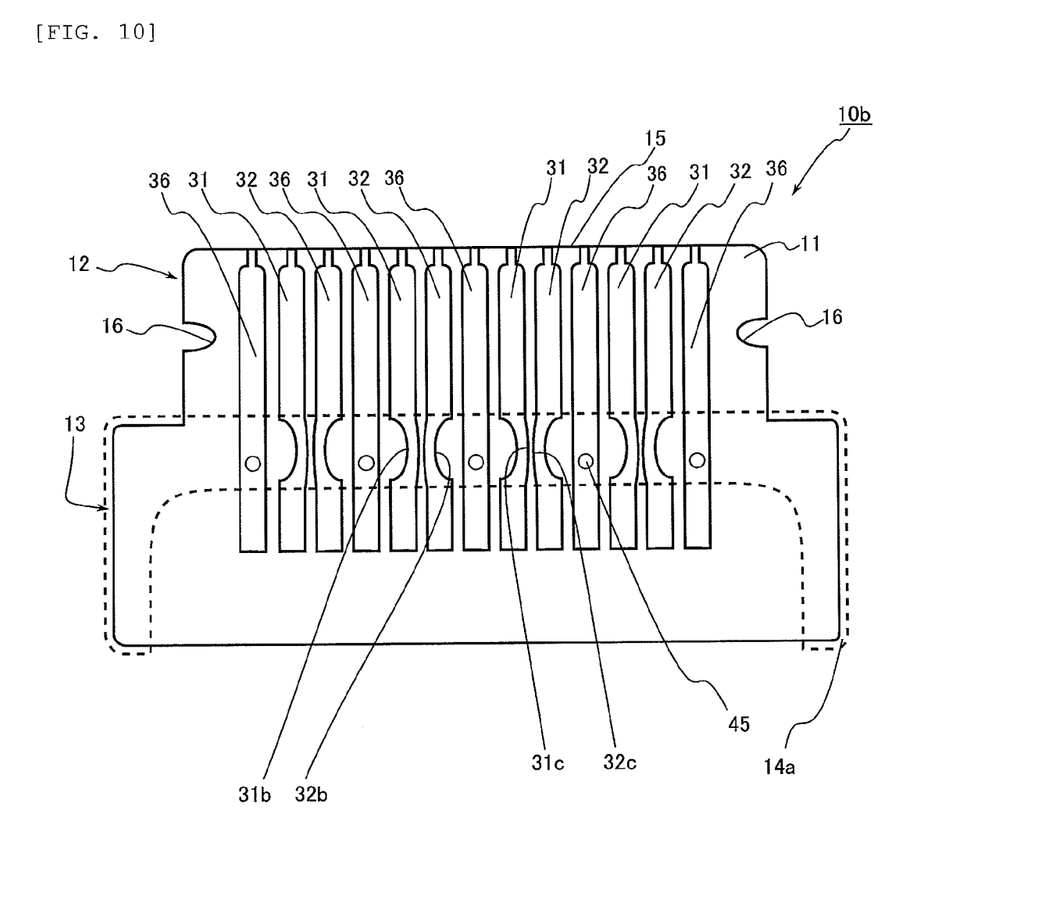
FIG. 10 is a front view of a connector in FIG. 9.

FIG. 9 is a plan view showing a cable assembly according to the third embodiment of the present invention.

As shown in FIG. 9, a cable assembly 102 of this embodiment includes, as the main constituents, multiple insulated cables 21 and a pair of connectors 10b.

The configuration of each of the insulated cables 21 is such that the center conductors 26 are covered with the insulating layer 27.

Next, the connector 10b will be described. FIG. 10 is a front view of the connector 10b shown in FIG. 9. As shown in FIG. 10, the connector 10b has the multiple ground terminals 36 and the multiple signal terminals 31, 32 provided parallel to each other on one surface of the substrate 11. Moreover, the ground layer 41 described in FIG. 4 is provided on the other surface of the substrate 11. The ground layer 41 is superposed on the multiple ground terminals 36 and the multiple signal terminals 31, 32 with the substrate 11 therebetween.

Each pair of the signal terminals 31, 32 are disposed between the ground terminals 36 in such a manner as to be adjacent to the ground terminals 36.

Further, the ground terminals 36 are electrically connected to the ground layer 41 through the first penetrating conductors 45.

Next, the connection between the connectors 10b and the insulated cables 21 will be described. As shown in FIG. 9, the center conductors 26 are exposed at opposite end portions of the insulated cables 21. Moreover, the center conductors 26 of some of the insulated cables 21 have opposite end portions respectively disposed on the ground terminals 36 of the connectors 10b and fixed thereto with an unillustrated solder. Further, the center conductors 26 of the other insulated cables 21 have opposite end portions disposed on the signal terminals 31, 32 of the connectors 10b and fixed thereto with an unillustrated solder. In this manner, the center conductors 26 of the insulated cables 21 connected to the ground terminals 36 serves as ground lines. Furthermore, the center conductors 26 of the insulated cables 21 connected to the signal terminals 31, 32 serve as signal lines.

According to the cable assembly 102 of this embodiment, a noise between the terminals can be suppressed. Conventionally, in a differential transmission system, insulated cables have been used in some cases. In such a case, a noise is generated between adjacent insulated cables. For this reason, as the insulation wires used in the differential transmission system, two insulated cables are twisted to be used. However, in this embodiment, such a noise can be suppressed. Accordingly, the cables can be arranged parallel to each other as in this embodiment. By this, cost reduction can be achieved in comparison with a cable assembly in which two cables are twisted. Moreover, since the need to twist two cables is eliminated, the thickness of the cable assembly can be suppressed, and thus the cable assembly can be used even when the thickness of a cable assembly is strictly restricted (Fourth Embodiment)

Next, a fourth embodiment of the present invention will be described in detail with reference to FIGS. 11 and 12. Note that constituents same or equivalent to those in the first embodiment are denoted by the same reference numerals, and redundant description will be omitted unless otherwise specifically stated.

Figure 11:
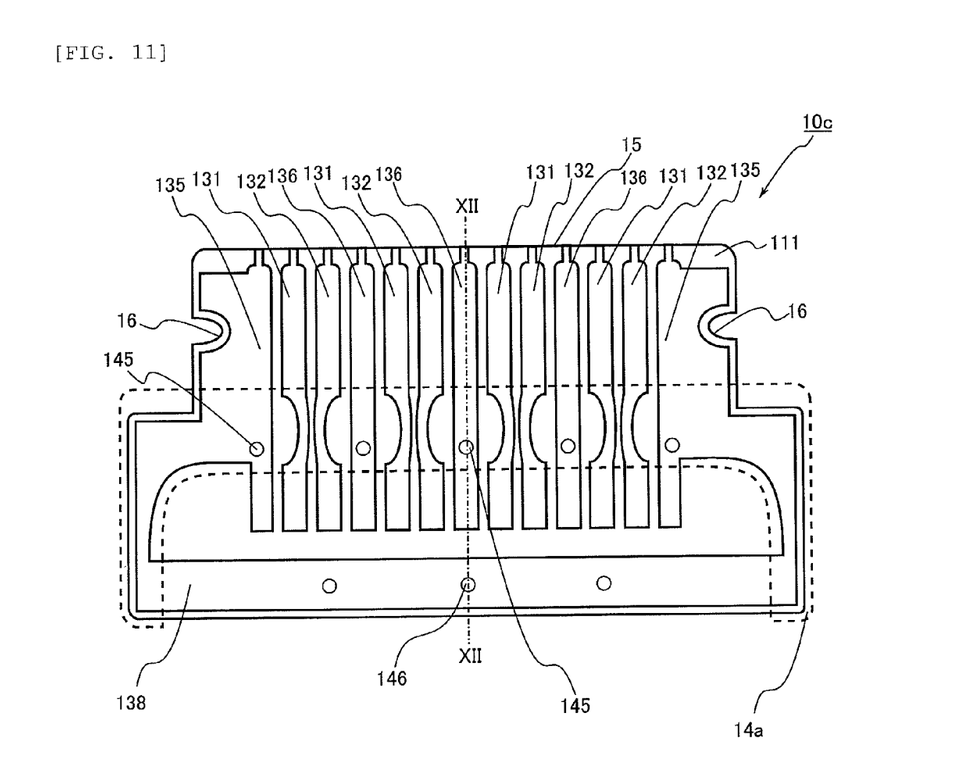
FIG. 11 is a rear view of a connector in a cable assembly according to a fourth embodiment of the present invention.

FIG. 11 is a rear view of a connector in a cable assembly according to the embodiment. FIG. 12 is a cross-sectional view of the connector shown in FIG. 11, taken along the line XII-XII. A connector 10c of the cable assembly in this embodiment has, in the front view, the same configuration as the configuration of the front surface of the connector 10 of the first embodiment shown in FIG. 3. Moreover, as shown in FIG. 12, the connector 10c includes a second substrate 111 in addition to the connector 10 of the first embodiment, the second substrate 111 being the same substrate as the substrate 11 of the connector 10 of the first embodiment. The second substrate 111 has one surface facing a side on which no substrate 11 is provided, and the other surface facing the ground layer 41. Further, the second substrate 111 adheres to the ground layer 41 with an adhesive 52. Furthermore, as shown in FIG. 11, on the one surface of the second substrate 111, that is, the rear surface of the connector 10c, provided are: second ground terminals 135, 136 the same as the ground terminals 35, 36 of the connector 10; second signal terminals 131, 132 the same as the signal terminals 31, 32 of the connector 10; and a second outer-conductor common connection part 138 the same as the outer-conductor common connection part 38 of the connector 10. Thus, the connector 10c of this embodiment has, in front and rear view, the same configuration as the connector 10 of the first embodiment shown in FIG. 3. The ground layer 41 is disposed between the substrate 11 and the second substrate 111.

Figure 12:
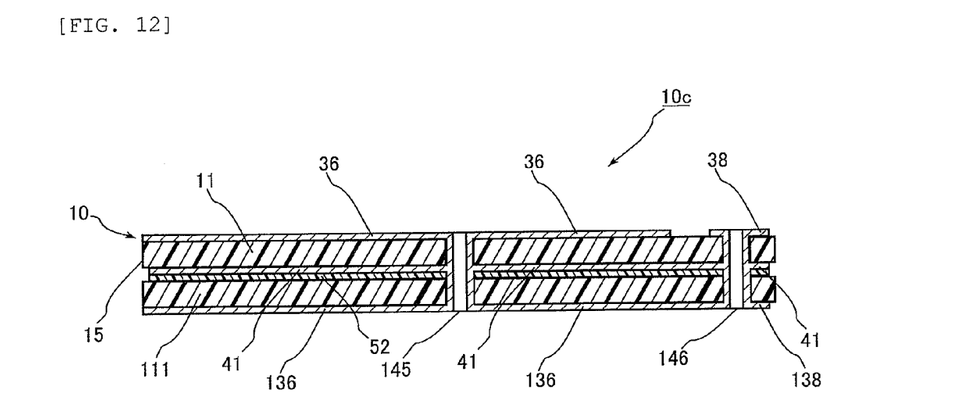
FIG. 12 is a cross-sectional view of the connector, taken along the line XII-XII in FIG. 11.

Additionally, as shown in FIG. 12, first penetrating conductors 145 penetrate the substrate 11 and the second substrate 111, and electrically connect the ground terminal 36 on the substrate 11 and the ground terminal 136 on the second substrate 111 to the ground layer 41. Similarly, the second penetrating conductors 146 penetrate the substrate 11 and the second substrate 111, and electrically connect the outer-conductor common connection part 38 on the substrate 11 and the outer-conductor common connection part 138 on the second substrate 111 to the ground layer 41. Such first penetrating conductors 145 and second penetrating conductors 146 may be formed after the adhesion of the second substrate 111.

Next, the cable assembly using the connector 10c will be described. In the cable assembly of this embodiment, multiple coaxial cables the same as the coaxial cable 20 in the first embodiment are connected to a pair of the connectors 10c. Moreover, as in the cable assembly 100 of the first embodiment shown in FIG. 1, a center conductor and an outer conductor are exposed at each opposite end portions of the coaxial cables.

As described above, the connector 10c of this embodiment has, in front and rear view, the same configuration as the connector 10 of the first embodiment shown in FIG. 3. The multiple coaxial cables connected to the connector 10c are the same coaxial cables as the coaxial cables 20 shown in FIG. 2. Half of the cables are connected to the ground terminals 35, 36, the signal terminals 31, 32, and the outer-conductor common connection part 38 on the substrate 11. The remaining half of the cables are connected to the second ground terminals 135, 136, the second signal terminals 131, 132, and the second outer-conductor common connection part 138 on the second substrate 111.

As in the cable assembly 100 of the first embodiment shown in FIG. 1, among the coaxial cables connected to the ground terminals 35, 36, the signal terminals 31, 32, and the outer-conductor common connection part 38 on the substrate 11, some of the coaxial cables have center conductors disposed on ground terminals 35, 36 on the substrate 11, while the other coaxial cables have center conductors disposed on the signal terminals 31, 32 on the substrate 11. The coaxial cables are fixed thereto with a solder. Further, outer conductors of the coaxial cables having the center conductors connected to the ground terminals 35, 36 and the signal terminals 31, 32 on the substrate 11 are disposed on the outer-conductor common connection part 38 and fixed thereto with a solder while being sandwiched between the outer-conductor common connection part 38 and the ground bar.

Similarly, among the coaxial cables connected to the second ground terminals 135, 136, the second signal terminals 131, 132, and the second outer-conductor common connection part 138 on the second substrate 111, some of the coaxial cables have center conductor disposed on the second ground terminals 135, 136 on the second substrate 111, while the other coaxial cables have center conductors disposed on the second signal terminals 131, 132 on the second substrate 111. The coaxial cables are fixed thereto with a solder. Further, outer conductors of the coaxial cables having the center conductors connected to the second ground terminals 135, 136 and the second signal terminals 131, 132 on the second substrate 111 are disposed on the second outer-conductor common connection part 138 and fixed thereto with an solder while being sandwiched between the second outer-conductor common connection part 138 and a ground bar.

In this manner, on the substrate 11 and the second substrate 111, the center conductors connected to the ground terminals and the second ground terminals as well as the outer conductors connected to the outer-conductor common connection part and the second outer-conductor common connection part serve as ground lines. Furthermore, on the substrate 11 and the second substrate 111, the center conductors connected to the signal terminals and the second signal terminals serve signal lines.

According to the cable assembly in this embodiment, generation of a noise due to crosstalk and generation of a noise due to signal reflection attributed to impedance mismatching are suppressed. Generation of a noise can be suppressed during high-speed signal transmission. Furthermore, since the signal lines are connected on both surfaces of the connector 10c, the need to increase the width is eliminated and a larger number of signals can be transmitted.

Hereinabove, the present invention has been described by taking the first to the fourth embodiments as examples. However, the present invention is not limited thereto.

For example, in each embodiment, the multiple holes 43 provided in the ground layer 41 can have any shape. For example, multiple round holes may be provided.

Moreover, in each embodiment, the connector is formed of a flexible printed wiring board. Nevertheless, the connector does not always have to be the flexible printed wiring board, and may be a printed wiring board using a substrate having no flexibility.

Moreover, in each embodiment, the ground layer 41 is formed to cover substantially the entire substrate except for the vicinity of the connector edge 15. Nevertheless, the present invention is not limited thereto. The ground layer 41 may be in contact with the connector edge 15. This allows each signal terminal to be completely superposed on the ground layer 41.

Moreover, in the first embodiment, no hole 43 is formed at the positions of the ground layer 41 that are superposed on the ground terminals 35, 36 and on the outer-conductor common connection part 38. Nevertheless, a hole 43 may be formed at least some of the positions of the ground layer 41 that are superposed on the ground terminals 35, 36 and on the outer-conductor common connection part 38.

Moreover, in each embodiment, at least one of the multiple signal terminals 31, 32 may have a length different from those of the other signal terminals 31, 32. Similarly, in the fourth embodiment, at least one of the multiple second signal terminals 131, 132 may have a length different from those of the other second signal terminals 131, 132.

Moreover, in each embodiment, the distance between the centers of at least a pair of the signal terminals 31, 32 adjacent to each other may be different from the distances between the centers of the other pairs of the signal terminals 31, 32 adjacent to each other. Similarly, in the fourth embodiment, the distance between the centers of at least a pair of the second signal terminals 131, 132 adjacent to each other may be different from the distances between the centers of the other pairs of the second signal terminals 131, 132 adjacent to each other.

Furthermore, in the fourth embodiment, the front surface and the rear surface of the connector have the same configuration as the configuration of the front surface of the connector 10 of the first embodiment. Nevertheless, the present invention is not limited thereto. The front surface and the rear surface thereof may have the same configurations as the front surface of the connector 10*a* of the second embodiment and the front surface of the connector 10*b* of the third embodiment.

INDUSTRIAL APPLICABILITY

The present invention provides: a connector with which a cable assembly capable of achieving high-speed signal transmission can be formed; and a cable assembly using the connector.

EXPLANATION OF REFERENCE NUMERALS

10, 10*a*, 10*b*, 10*c* . . . connector
11, 111 . . . substrate
20 . . . coaxial cable
21 . . . insulated cable
26 . . . center conductor
27 . . . insulating layer
28 . . . outer conductor
29 . . . sheath
35, 36, 135, 136 . . . ground terminal
31, 32, 33, 131, 132 . . . signal terminal
38, 38*a*, 138 . . . outer-conductor common connection part
41, 41*a* . . . ground layer
42, 42*a* . . . grid portion
43 . . . hole
45, 145 . . . first penetrating conductor
46, 146 . . . second penetrating conductor
51 . . . ground bar
52 . . . adhesive
100, 101, 102 . . . cable assembly

The invention claimed is:

1. A connector comprising:
   a substrate;
   a plurality of signal terminals provided parallel to each other on one surface of the substrate; and
   a ground layer provided on another surface of the substrate, wherein
   each of the signal terminals and the ground layer are disposed in such a manner that at least a portion of the ground layer and at least a portion of each signal terminal are superposed on each other with the substrate therebetween,
   a plurality of holes are formed in at least part of the portion of the ground layer superposed on each signal terminal, and
   a largest diameter of each of the holes is smaller than a distance between centers of the signal terminals adjacent to each other;
   an outer-conductor common connection part provided on the one surface of the substrate in such a manner as to be separated at a predetermined distance from each signal terminal; and
   a second penetrating conductor provided in such a manner as to penetrate the substrate, and connecting the ground layer to the outer-conductor common connection part, wherein
   the distance between each signal terminal and the outer-conductor common connection part is 0.15 to 0.5 mm.

2. The connector according to claim 1, wherein at least one of the signal terminals has a length different from those of the other signal terminals.

3. The connector according to claim 1, wherein a distance between centers of at least a pair of the signal terminals adjacent to each other is different from distances between centers of the other pairs of the signal terminals adjacent to each other.

4. A cable assembly comprising:
   a pair of the connectors according to claim 1;
   a plurality of signal lines provided parallel to each other; and
   at least one ground line, wherein
   the signal lines have opposite end portions connected to the signal terminals of each of the connectors, and
   the ground line has opposite end portions each electrically connected to the ground layer of each connector.

5. The connector according to claim 1, further comprising:
   at least one ground terminal provided between the signal terminals in such a manner as to be superposed on the ground layer with the substrate therebetween; and
   a first penetrating conductor provided in such a manner as to penetrate the substrate, and connecting the ground layer to the ground terminal.

6. The connector according to claim 5, wherein the holes are not formed in the portion of the ground layer superposed on the ground terminal.

7. A connector comprising:
   a substrate;
   a plurality of signal terminals provided parallel to each other on one surface of the substrate; and
   a ground layer provided on another surface of the substrate, wherein
   each of the signal terminals and the ground layer are disposed in such a manner that at least a portion of the ground layer and at least a portion of each signal terminal are superposed on each other with the substrate therebetween,
   a plurality of holes are formed in at least part of the portion of the ground layer superposed on each signal terminal, and
   a largest diameter of each of the holes is smaller than a distance between centers of the signal terminals adjacent to each other;
   a second substrate; and
   a plurality of second signal terminals provided parallel to each other on one surface of the second substrate, wherein
   the second substrate is disposed in such a manner that another surface of the second substrate faces the ground layer, and
   each of the second signal terminals is disposed in such a manner that the portion of the ground layer where the plurality of holes are formed and at least a portion of each second signal terminal are superposed on each other with the second substrate therebetween.

8. The connector according to claim 7, further comprising:
   an outer-conductor common connection part provided on the one surface of the substrate in such a manner as to be separated at a predetermined distance from each signal terminal;
   a second outer-conductor common connection part provided on the one surface of the second substrate in such a manner as to be separated at a predetermined distance from each second signal terminal; and a second penetrating conductor provided in such a manner as to penetrate the substrate and the second substrate, and connecting the outer-conductor common connection part and the second outer-conductor common connection part to the ground layer, wherein the distance between each signal terminal and the outer-conductor common connection part and the distance between each second signal terminal and the second outer-conductor common connection part are both 0.15 to 0.5 mm.

9. The connector according to claim 7, wherein at least one of the second signal a terminal has a length different from those of the other second signal terminals.

10. The connector according to claim 7, wherein a distance between centers of at least a pair of the second signal terminals adjacent to each other is different from distances between centers of the other pairs of the second signal terminals adjacent to each other.

11. A cable assembly comprising:
a pair of the connectors according to claim 7;
a plurality of signal lines provided parallel to each other; and
at least one ground line, wherein
among the plurality of signal lines, some signal lines have opposite end portions connected to the signal terminals of each of the connectors, while the other signal lines have opposite end portions connected to the second signal terminals of each connector, and
the ground line has opposite end portions each electrically connected to the ground layer of each connector.

12. The connector according to claim 7, further comprising:
at least one ground terminal provided between the signal terminals in such a manner that at least a portion of the ground terminal is superposed on the ground layer with the substrate therebetween;
at least one second ground terminal provided between the second signal terminals in such a manner that at least a portion of the second ground terminal is superposed on the ground layer with the second substrate therebetween; and
a first penetrating conductor provided in such a manner as to penetrate the substrate and the second substrate, and connecting the ground terminal and the second ground terminal to the ground layer.

13. The connector according to claim 12, wherein the holes are not formed in the portion of the ground layer superposed on the ground terminal and the second ground terminal.

* * * * *